United States Patent
Tejero et al.

(10) Patent No.: US 11,621,146 B2
(45) Date of Patent: Apr. 4, 2023

(54) PLASMA IMPEDANCE TOMOGRAPHY FOR PLASMA PARAMETER IMAGING

(71) Applicant: The Government of the United States of America, as represented by the Secretary of the Navy, Arlington, VA (US)

(72) Inventors: Erik Tejero, Falls Church, VA (US); George Gatling, Fairfax, VA (US); William Amatucci, Fairfax, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 317 days.

(21) Appl. No.: 17/070,002

(22) Filed: Oct. 14, 2020

(65) Prior Publication Data
US 2021/0118644 A1    Apr. 22, 2021

Related U.S. Application Data

(60) Provisional application No. 62/916,813, filed on Oct. 18, 2019.

(51) Int. Cl.
*H01J 37/26* (2006.01)
*G01N 9/36* (2006.01)
*G01R 33/00* (2006.01)

(52) U.S. Cl.
CPC .............. *H01J 37/266* (2013.01); *G01N 9/36* (2013.01); *G01R 33/0094* (2013.01)

(58) Field of Classification Search
CPC ...... H01J 37/266; G01N 9/36; G01R 33/0094
See application file for complete search history.

(56) References Cited

U.S. PATENT DOCUMENTS

| | | | | |
|---|---|---|---|---|
| 2010/0300620 A1* | 12/2010 | Kanda | ............... | H01J 37/32935 |
| | | | | 156/345.28 |
| 2016/0281670 A1* | 9/2016 | Ikeda | ................... | H05H 1/46 |
| 2018/0053634 A1* | 2/2018 | Kraus | ............... | H01J 37/32201 |

OTHER PUBLICATIONS

R. A. Stern and J. A. Johnson, "Plasma Ion Diagnostics Using Resonant Fluorescence," Phys. Rev. Lett., 34, 1548, (1975).
J. F. Camacho and R. S. Granetz, "Soft x-ray tomography diagnostic for the Alcator C tokamak," Rev. Sci. Instrum., 57, 417, (1986).
L. Borcea, "Electric impedance tomography," Inverse Problems, 18, R99, (2002).
E. C. Merritt, A. G. Lynn, M. A. Gilmore, C. Thoma, J. Loverich, and S. C. Hsu, "Multi-chord fiber-coupled interferometry of supersonic plasma jets," Rev. Sci. Instrum., 83, 10D523, (2012).

(Continued)

*Primary Examiner* — Nicole M Ippolito
(74) *Attorney, Agent, or Firm* — US Naval Research Laboratory; Joslyn Barritt

(57) ABSTRACT

A method for non-invasively imaging plasma parameters has been invented. Crossed dipole pairs are used to differentiate changes in the measured complex self- and mutual impedances due to plasma density and magnetic field. Measurements of the complex self-impedance and mutual impedance between pairs of antennas over a wide range of frequencies provide spatial information to create an image of the plasma density and magnetic field. The spectral information is acquired simultaneously using a Gaussian monopulse as the driver signal.

10 Claims, 9 Drawing Sheets

(56) References Cited

OTHER PUBLICATIONS

S. E. Segre, "A review of plasma polarimetry—theory and methods," Plasma Phys. Control. Fusion, 41, R57, (1999).
K. G. Balmain, "Impedance of a Short Dipole in a Magnetoplasma," IEEE Trans. Antennas Propagat., 12, 605 (1964).
Agilent Impedance Measurement Handbook, 4th Ed, (2009), pp. 216-219.
Edmund Spencer, David Clark, and Sai Krishna Vadepu, "A Time-Domain Impedance Probe for Fast Measurements of Electron Plasma Parameters in the Ionosphere," IEEE Transactions on Plasma Science, vol. 47, No. 2, Feb. 2019, pp. 1322-1329.

* cited by examiner

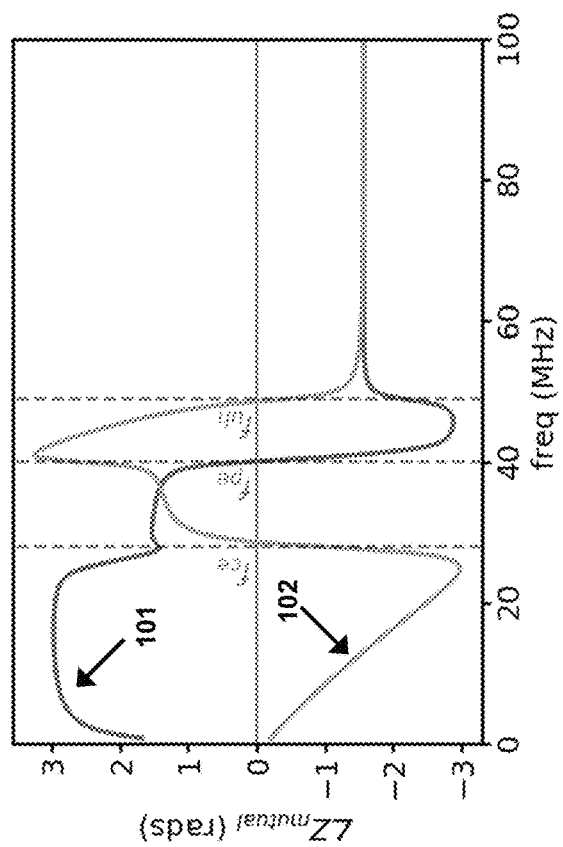
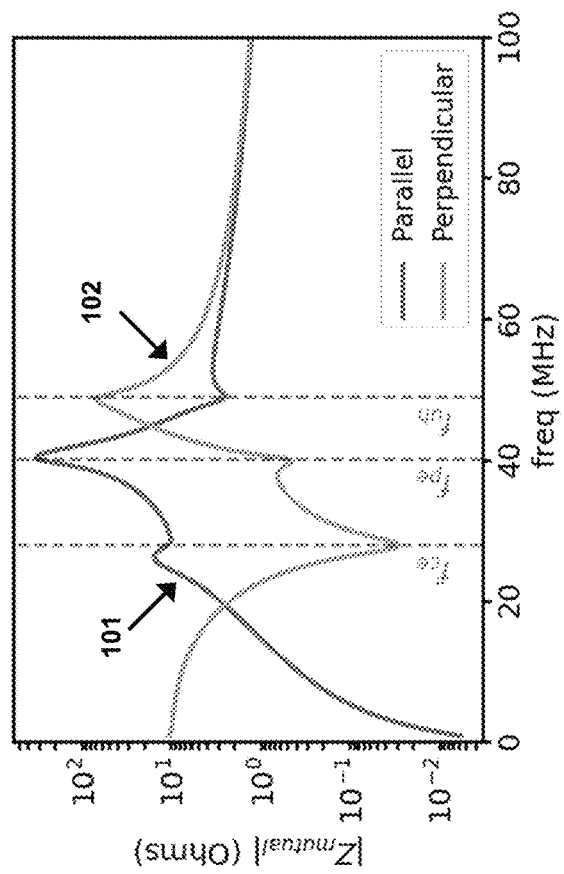
FIG. 1B
FIG. 1A

PLASMA IMPEDANCE TOMOGRAPHY FOR PLASMA PARAMETER IMAGING

CROSS-REFERENCE

This Application is a Nonprovisional of and claims the benefit of priority under 35 U.S.C. § 119 based on U.S. Provisional Patent Application No. 62/916,813 filed on Oct. 18, 2019. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case # 111979.

TECHNICAL FIELD

The present invention relates to measurement of plasma parameters such as electron plasma density and magnetic field in a time-varying plasma.

BACKGROUND

Plasma density is a key metric used to quantitatively describe and classify plasma. The Earth is surrounded by a sparse plasma in the ionosphere, denser plasma is used in the manufacture of semiconductor devices, and extremely hot and dense plasma is central to fusion research. A standard device used to measure plasma density is the Langmuir probe, a biased conductor placed directly in the plasma. See F. F. Chen, J. D. Evans, and W. Zawalski, "Electric probes" in *Plasma Diagnostic Techniques*, edited by R. H. Huddlestone and S. L. Leonard, Citeseer, (1965). However, while Langmuir probes are simple to construct and are in widespread use today, they are limited to invasive single point measurements that can disrupt the plasma in some cases or be destroyed by the plasma in other cases.

Because of the drawbacks of Langmuir probes, a variety of techniques have been developed to make spatial, non-invasive measurements of plasma.

Laser induced fluorescence (LIF) excites ions of the plasma to higher energy states, and observes the photons released when the ion relaxes to its original energy. See R. A. Stern and J. A. Johnson, "Plasma Ion Diagnostics Using Resonant Fluorescence," *Phys. Rev. Lett.*, 34, 1548, (1975). LIF can measure particle velocity distributions and is useful in the study of flows of particles in plasma, but can only give a relative, not absolute, measurement of density.

Plasma tomography uses measurements of plasma radiation along lines of sight to reconstruct spatial plasma density profiles. J. F. Camacho and R. S. Granetz, "Soft x-ray tomography diagnostic for the Alcator C tokamak," *Rev. Sci. Instrum.*, 57, 417, (1986). However, such methods require the high-density and high-temperature environments of fusion plasmas to produce the required plasma radiation.

Electrical impedance tomography (EIT) uses low-frequency measurements of boundary voltage and current to reconstruct an image of internal conductivity, see L. Borcea, "Electric impedance tomography," *Inverse Problems*, 18, R99, (2002), but no reconstruction algorithm have been applied to plasmas.

Laser plasma interferometry can provide line integrated density measurements and multi-chord systems can invert this data to provide density profiles with good temporal resolution. See E. C. Merritt, A. G. Lynn, M. A. Gilmore, C. Thoma, J. Loverich, and S. C. Hsu, "Multi-chord fiber-coupled interferometry of supersonic plasma jets," *Rev. Sci. Instrum.*, 83, 10D523, (2012). This method is non-invasive and has provided good results when large refraction does not occur and if the assumption of rotational symmetry holds.

Polarimetry measurements using Faraday rotation can provide line integrated time-resolved measurements of magnetic field. See S. E. Segre, "A review of plasma polarimetry—theory and methods," *Plasma Phys. Control. Fusion*, 41, R57, (1999). These measurements are sufficiently difficult to make that tomographic systems have not been developed to provide spatial information.

SUMMARY

This summary is intended to introduce, in simplified form, a selection of measurement concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a method of remotely imaging the parameters of both static and time-varying plasmas by measuring the complex self-impedance and mutual impedance between successive pairs of antennas in a plasma impedance sensor array over a wide range of frequencies.

In accordance with the present invention, the antennas can be placed at the edge of the plasma, negating the need to insert a probe into the plasma, which can disturb the plasma being measured or lead to destruction of the probe. Mutual impedance measurements provide line-averaged spatial information across the plasma, which can be inverted to make images of the plasma dielectric. Plasma parameter profiles such as density and magnetic field can be determined from the plasma dielectric profiles. Using a pulsed measurement technique allows for measurement rates at approximately 1% of the plasma frequency.

This plasma impedance tomography (PIT) approach of the present invention can provide absolute plasma density and magnetic field measurements for laboratory and fusion plasmas and imaging of dynamic plasma density structures.

BRIEF DESCRIPTION OF THE DRAWINGS

FIGS. 1A and 1B are plots showing an exemplary predicted impedance probe spectrum magnitude (FIG. 1A) and phase (FIG. 1B) between two dipole antennas immersed in a uniform magnetized plasma.

DETAILED DESCRIPTION

Figure 2:
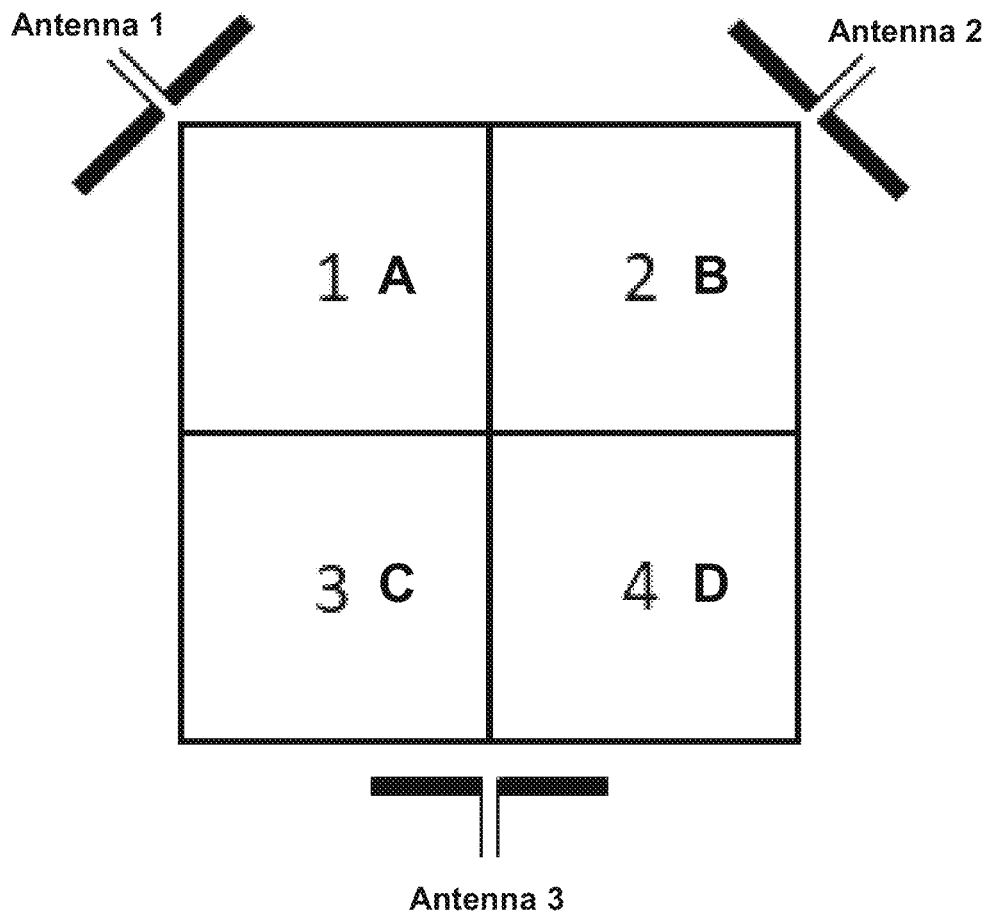
FIG. 2 is a block schematic illustrating an exemplary arrangement of dipole antennas around a region of a plasma divided into pixels in accordance with the plasma impedance tomography method of the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a method of remotely imaging parameters of both static and time-varying plasmas by measuring the complex self-impedance and mutual impedance between successive pairs of antennas in a plasma impedance sensor array over a wide range of frequencies.

Although the discussion below assumes that the antennas are dipole antennas, one skilled in the art would readily understand that other types of antennas such as loop antennas, microwave horns, and many others can also be used in the method for imaging plasma parameters described herein, and all such alternative configurations are deemed to be within the scope and spirit of the present disclosure.

In accordance with the present invention, the antennas can be placed at the edge of the plasma, negating the need to insert a probe into the plasma, which can disturb the plasma being measured or lead to destruction of the probe. Mutual impedance measurements provide line-averaged spatial information across the plasma, which can be inverted to make images of the plasma dielectric. Plasma parameter profiles such as density and magnetic field can be determined from the plasma dielectric profiles. Using a pulsed measurement technique allows for measurement rates at approximately 1% of the plasma frequency.

This plasma impedance tomography (PIT) approach of the present invention can provide absolute plasma density and magnetic field measurements for laboratory and fusion plasmas and imaging of dynamic plasma density structures.

If the stimulus applied to each antenna is above the ion plasma frequency $\omega_{pi}^2 = e^2 n_i / \epsilon_0 m_i$, only the electrons can respond to the stimulus, and the relative frequency-dependent dielectric constant for an unmagnetized plasma can be written as:

$$\epsilon = 1 - \frac{\omega_{pe}^2}{\omega(\omega + i\nu)}, \tag{1}$$

where $\omega_{pe}^2 = e^2 n_e / \epsilon_0 m_e$, $n_{i,e}$ is the ion or electron density, $\epsilon_0$ is the permittivity of free space, $\nu$ is the sum of the frequency of collisions between electrons and electrons, neutral particles, and ions in the plasma, e is the charge on the electron, and $m_{i,e}$ is the ion or electron mass.

When a background magnetic field B is present, the simple dielectric constant given above is replaced with a dielectric tensor given by:

$$\epsilon = \begin{bmatrix} K_1 & -iK_2 & 0 \\ iK_2 & K_1 & 0 \\ 0 & 0 & K_0 \end{bmatrix} \tag{2}$$

$$K_0 = 1 - \frac{\omega_{pe}^2}{\omega(\omega + i\nu)} \tag{3}$$

$$K_1 = 1 - \frac{\omega_{pe}^2(\omega + i\nu)}{\omega[(\omega + i\nu)^2 - \Omega_{ce}^2]} \tag{4}$$

$$K_2 = \frac{\omega_{pe}^2 \Omega_{ce}^2}{\omega[(\omega + i\nu)^2 - \Omega_{ce}^2]} \tag{5}$$

where $\Omega_{ce} = eB/m_e$ is the electron cyclotron frequency. When a current is applied to an antenna immersed in a plasma, the electric field of the antenna is modified by the presence of the plasma. Since the modifications are frequency dependent, this gives rise to the plasma impedance spectrum.

The basis of the PIT method of the present invention lies in the mutual impedance measurement between a pair of antennas in a plasma. For a pair of antennas 1, 2, the ratio of the induced voltage $V_2$ on the second antenna due to the current $I_1$ in the first antenna is the mutual impedance $Z_{21} = V_2/I_1$. In an exemplary case, where the antennas are dipole antennas separated by a distance d and each antenna having a total length 2L, where L is the length of each "arm" of the dipole, the result of the self-impedance of a short dipole can be extended to determine the mutual impedance spectra between two short dipole antennas for parallel and perpendicular orientation with respect to the background magnetic field in a plasma:

$$Z_{21\parallel} = \frac{1}{i\omega 2\pi\epsilon_0 K_1 L} \left[ \ln \frac{\sqrt{K_1}}{\sqrt{K_0}} \frac{L}{d} - 1 \right] \tag{6}$$

$$Z_{21\perp} = \frac{1}{i\omega 2\pi\epsilon_0 \sqrt{K_1 K_0} L} \left[ \ln \frac{2L}{d\left(1 + \sqrt{\frac{K_1}{K_0}}\right)} - 1 \right] \tag{7}$$

(see K. G. Balmain, "Impedance of a Short Dipole in a Magnetoplasma," *IEEE Trans. Antennas Propagat.*, 12, 605 (1964)).

The plots in FIGS. 1A and 1B depict magnitude (FIG. 1A) and phase (FIG. 1B) of an exemplary mutual impedance spectrum for a uniform plasma with plasma electron density $n_e = 10^7$ cm$^{-3}$ under an applied magnetic field B=10 G, for an antenna parallel (101) to the magnetic field and an antenna perpendicular (102) to the field. The plots indicate resonances associated with key frequencies $f_{ce}$, $f_{pe}$, and $f_{uh}$ in the plasma used for measuring plasma parameters, shown by the dashed lines in the plots, where $f_{ce} = \Omega_{ce}/2\pi$ is the electron cyclotron frequency, $f_{pe} = \omega_{pe}/2\pi$ is the plasma frequency, and $f_{uh} = (f_{pe}^2 + f_{ce}^2)^{1/2}$ is the upper hybrid frequency. As can be seen from the plots in FIG. 1A, the plotline 101 for the antenna parallel to the magnetic field shows a resonant peak associated with the electron plasma frequency, while the plotline 102 for the antenna perpendicular to the magnetic field shows a resonant peak associated with the upper hybrid frequency. Using crossed dipole antennas at each node of the array with one parallel and one perpendicular to the magnetic field will provide greater accuracy in measurements of $n_e$ and B simultaneously. Zero crossings that occur in the phase of the impedance (FIG. 1B) provide clear indications of the locations of the resonant frequencies in the plasma.

The reconstruction procedure for imaging plasma parameters in accordance with the present invention can be illustrated by an exemplary small system of three dipole antennas, such as that illustrated in FIG. 2, where the self-impedance and mutual impedance between any two dipoles one and two are given by unknown nonlinear functions of the density and magnetic field everywhere in the system.

The plasma region of interest is partitioned into pixels, with the approximate density and magnetic field being assumed to be constant within each pixel. In the example illustrated in FIG. 2, the region is divided into a regular grid of four pixels A, B, C, and D, with dipole antennas Antenna 1, Antenna 2, and Antenna 3 arranged around them. The mutual impedance $Z_{21}$ between dipole Antennas 1 and 2 is then approximated by another unknown non-linear function, $f_{21}$, of the four densities and the four field quantities:

$$Z_{21}(n, B) \approx f_{21}(n_1, n_2, n_3, n_4, B_1, B_2, B_3, B_4), \quad (8)$$

where $n_1$, $n_2$, $n_3$, and $n_4$ are the plasma densities $n_i$ and $B_1$, $B_2$, $B_3$, and $B_4$ are the magnetic fields $B_i$ corresponding to pixels A, B, C, and D, respectively.

Using a Taylor expansion of $f_{21}$ around a suitable point $(\hat{n}_1, \ldots, \hat{B}_4)$ gives a linear approximation for $Z_{21}$:

$$Z_{21}(n_1, \ldots, B_4) - f_{21}(\hat{n}_1, \ldots, \hat{B}_4) \approx \Delta n_1 \frac{\partial f_{21}}{\partial n_1}\bigg|_{\hat{n}_1, \ldots, \hat{B}_4} \quad (9)$$
$$+ \ldots + \Delta B_1 \frac{\partial f_{21}}{\partial B_4}\bigg|_{\hat{n}_1, \ldots, \hat{B}_4}$$

where $\Delta n_i = n_i - \hat{n}_i$ and $\Delta B_i = B_i - \hat{B}_i$, $\hat{n}_i$ and $\hat{B}_i$ being the points around which the function is expanded.

In vector notation this can be written as:

$$Z_{21}(n_1, \ldots, B_4) - f_{21}(\hat{n}_1, \ldots, \hat{B}_4) \approx \begin{bmatrix} \frac{\partial f_{21}}{\partial n_1} \cdots \frac{\partial f_{21}}{\partial B_4} \end{bmatrix}\bigg|_{\hat{n}_1, \ldots, \hat{B}_4} \begin{bmatrix} \Delta n_1 \\ \vdots \\ \Delta B_4 \end{bmatrix}. \quad (10)$$

To reconstruct an image of magnetic field and plasma density from the measurements of impedance, we begin by repeating this procedure for each of the self- and mutual impedances $Z_{ij} = f_{ij}(n_i, \ldots, B_4)$ in the system, which yields the matrix equation $$\begin{bmatrix} Z_{11} - f_{11} \\ Z_{12} - f_{12} \\ \vdots \\ Z_{32} - f_{32} \\ Z_{33} - f_{33} \end{bmatrix} \approx \begin{bmatrix} \frac{\partial f_{11}}{\partial n_1} & \frac{\partial f_{11}}{\partial n_2} & \cdots & \frac{\partial f_{11}}{\partial B_3} & \frac{\partial f_{11}}{\partial B_4} \\ \frac{\partial f_{12}}{\partial n_1} & \frac{\partial f_{12}}{\partial n_2} & \cdots & \frac{\partial f_{12}}{\partial B_3} & \frac{\partial f_{12}}{\partial B_4} \\ \vdots & \vdots & \vdots & \vdots & \vdots \\ \frac{\partial f_{32}}{\partial n_1} & \frac{\partial f_{32}}{\partial n_2} & \cdots & \frac{\partial f_{32}}{\partial B_3} & \frac{\partial f_{32}}{\partial B_4} \\ \frac{\partial f_{33}}{\partial n_1} & \frac{\partial f_{33}}{\partial n_2} & \cdots & \frac{\partial f_{33}}{\partial B_3} & \frac{\partial f_{33}}{\partial B_4} \end{bmatrix}\Bigg|_{\hat{n}_1, \ldots, \hat{B}_4} \begin{bmatrix} \Delta n_1 \\ \Delta n_2 \\ \vdots \\ \Delta B_3 \\ \Delta B_4 \end{bmatrix}. \quad (11)$$

The functions $f_{ij}$ have no closed form, so the values of impedances and the values of the derivatives at the point of Taylor expansion must be found numerically by simulating the forward problem. Using m for the vector of measured impedances, S for the Jacobian, or sensitivity matrix, and p for the vector of pixel parameters (density and magnetic field), this can be compactly written $$m = Sp. \quad (12)$$

In an exemplary system with A dipoles, where the region of interest has been divided into a grid of B×B pixels, m will be an ($A^2 \times 1$) column vector, S will be an ($A^2 \times 2B^2$) matrix, and p will be a ($B^2 \times 1$) column vector.

In typical systems, there will be many more pixels than measurements of mutual impedance, and so S will generally not be full rank, and its inverse will not exist. However, approximate solutions can be found using a variety of methods to regularize ill-posed problems such as this one. One exemplary reconstruction method is to apply the Moore-Penrose pseudoinverse known in the art to matrix S, which gives $$p = (S^T S)^{-1} S^T m. \quad (13)$$

Although the Moore-Penrose pseudoinverse reconstruction algorithm is used in the present disclosure to illustrate the PIT method of the present invention, one skilled in the art will readily understand that any suitable electrical impedance tomography (EIT) reconstruction algorithm, such as linear back-projection, Tikhonov regularization, Newton-Raphson and iterative Tikhonov methods, and projected Landweber, can also be used where appropriate. In some cases, the Gauss-Newton method can be used to find a solution without first linearizing the model of mutual impedance. One skilled in the art would readily understand that any suitable reconstruction methods can be used, and use of any and all such antenna inversion algorithms is deemed to be within the scope of the present disclosure.

The PIT method of the present invention can be accomplished by means of an apparatus comprising a suitable antenna array arranged around the plasma, an arbitrary function generator to provide a stimulus to one or more of the antennas, a switch to control which antenna is being driven and terminate the inputs of the receiving antennas, a measurement circuit for each antenna to provide the oscillating voltage and current measurements, a multichannel oscilloscope to record the measurements, and a computer programmed with appropriate software that processes the results and produces maps, plots, and other visual depictions of the plasma parameters.

Figure 3A:
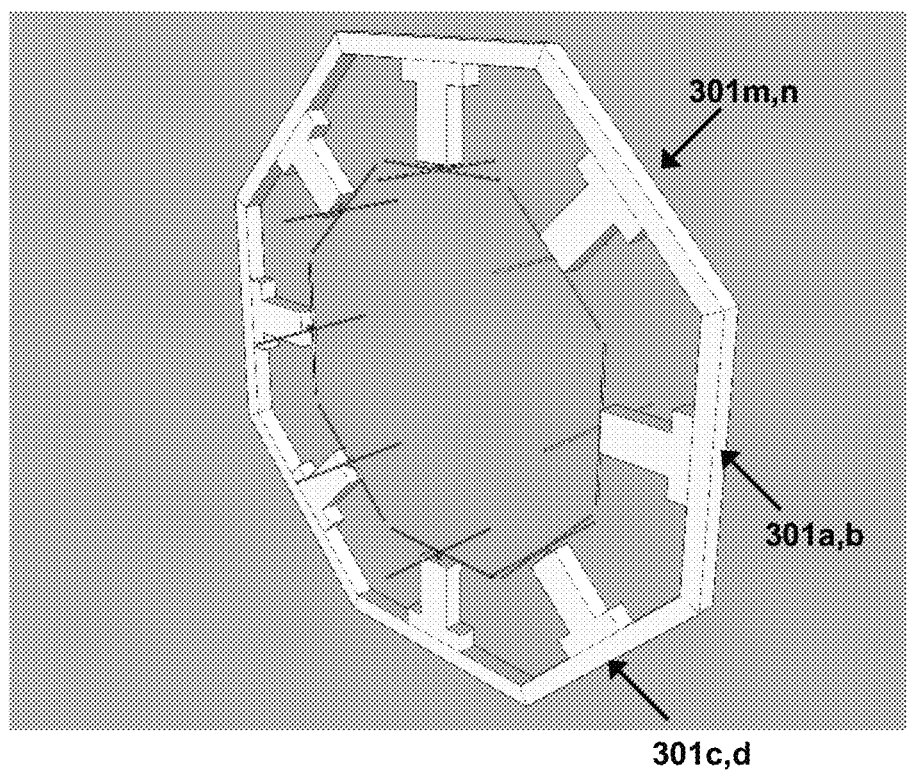
FIGS. 3A-3C are block schematics illustrating aspects of exemplary plasma impedance sensor arrays that can be used in the plasma impedance tomography method of the present invention.
Figure 3B:
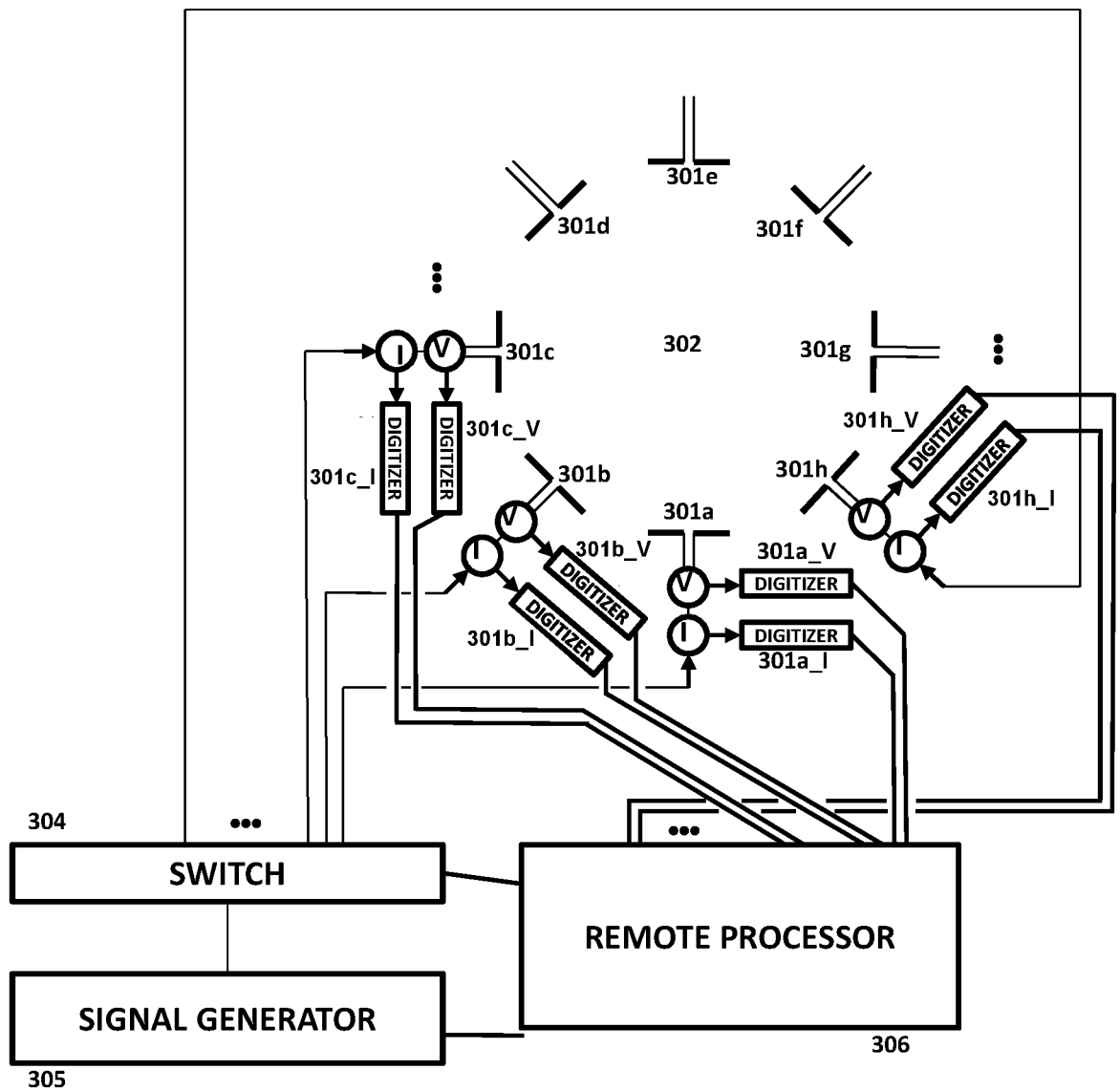
Figure 3C:
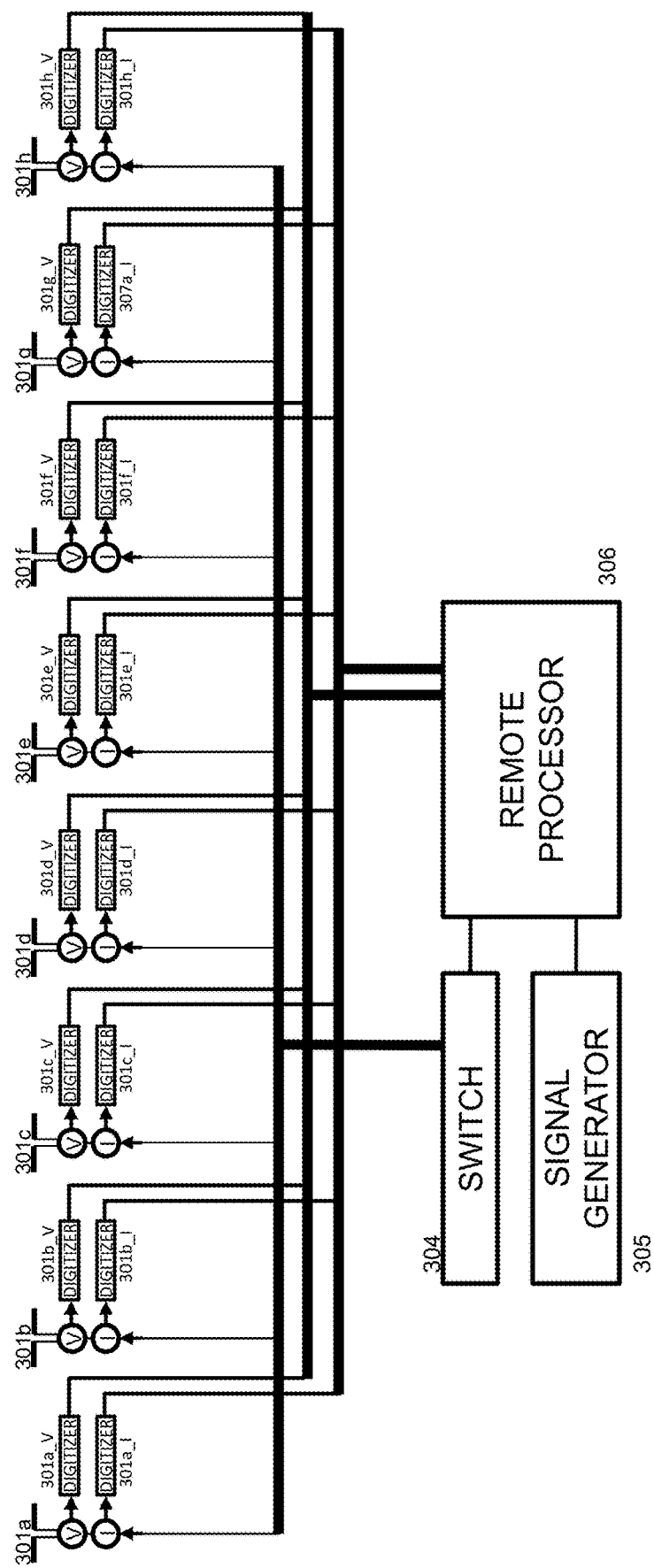

FIGS. 3A-3C illustrate aspects of exemplary sensor apparatus that can be used in the method of the present invention. As illustrated in an FIGS. 3A-3C, the apparatus includes a sensor array, a signal generator 305 coupled to a remote processor 306 and a switch 304. The sensor array can include a predetermined plurality of antennas 301a, 301b . . . 301n along all or part of the boundary of a predetermined region 302 of the plasma to be imaged. Each antenna is electrically short and thin, such that its total length is much smaller than the free space wavelength over the frequencies of interest and the radius of the antenna is much smaller than its length.

In the exemplary embodiments illustrated in FIGS. 3A and 3B, the sensor array comprises eight crossed dipole antennas (for a total of 16 plasma impedance sensor elements) situated along the boundary of the region of interest arranged in a predetermined manner, e.g., equally spaced in a plane so as to encircle the area of the plasma to be imaged, with each crossed dipole pair having one antenna parallel and one antenna perpendicular to a background magnetic field assumed to be imposed by an external source. In an alternative embodiment, illustrated in FIG. 3C, the antennas are arranged in a linear array situated so as to be parallel to an axis of the plasma. One skilled in the art will readily understand that both more and fewer antennas, other types of antennas such as loop antennas, or other arrangements of antennas, including three dimensional arrangements, can be used, and use of any such antenna arrays is deemed to be within the scope of the present disclosure.

These assumptions about the antennas in this exemplary system simplify the presentation of the method, and one skilled in the art would readily understand that more complex antennas can be modelled, either analytically or numerically, and all such alternative antenna models are deemed to be within the scope and spirit of the present disclosure.

As described in more detail below, each of the antennas $301a, 301b, \ldots 301n$ is coupled to a signal generator $305$ by means of a switch $304$ which allows a predetermined oscillating signal to be controllably and selectively applied to the antennas in a predetermined manner, e.g., in a predetermined order. A remote processor controls which output of the switch is connected to the input while the other outputs are terminated in the characteristic impedance of the system. Each of the antennas $301a, 301b, \ldots 301n$ is coupled to a corresponding pair of digitizers configured to record the voltage and current produced by application of the oscillating signal and to output the recorded data, either directly to remote processor $306$ or to a data storage device for later processing by a remote processor.

The schematic in FIG. 3B illustrates important aspects of the circuit comprising a plasma impedance sensor element. The circuit must permit driving the antenna element during the antenna's time as the source (see step 1 of the procedure described below.) The circuit must also facilitate a measurement of the voltage and electric current in the antenna. For the exemplary antenna array shown in FIG. 3B, the RF-IV measurement method was used, as described in *Agilent Impedance Measurement Handbook*, $4^{th}$ Ed, (2009), pp. 2-16-2-19. This method uses transformers to measure the voltage and current in the antenna, in a manner as depicted by the block schematic in FIG. 4.

Figure 4:
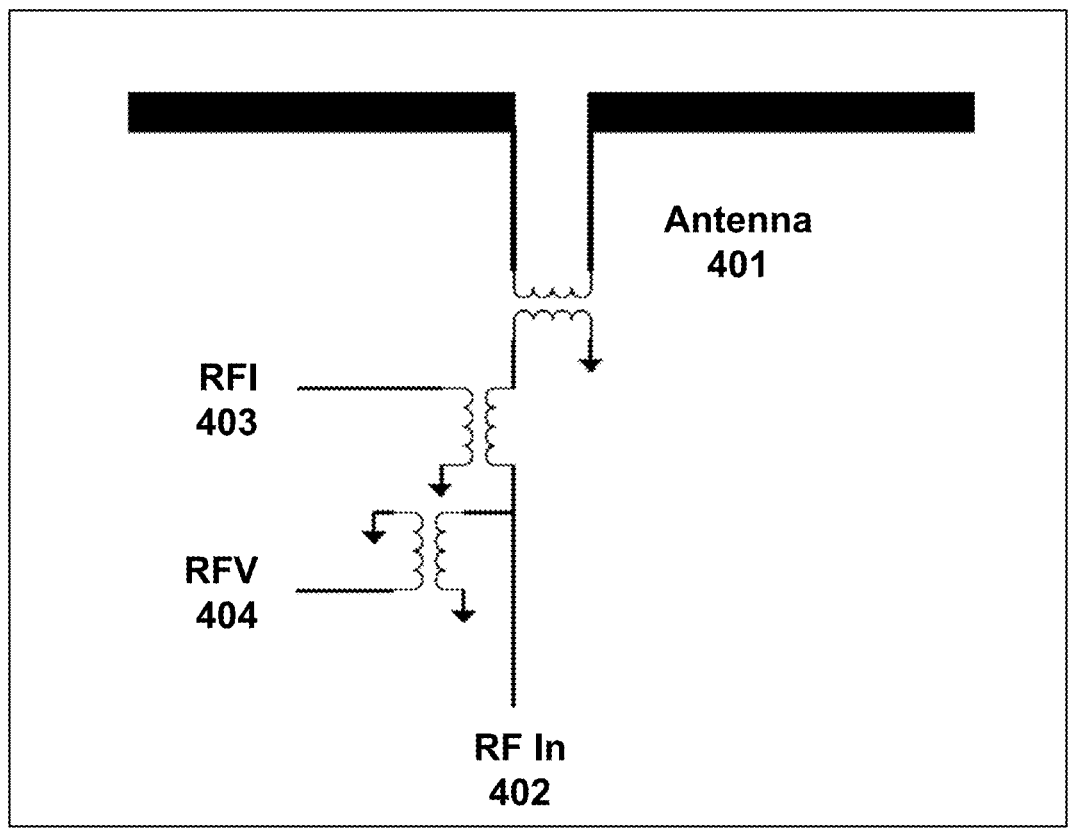
FIG. 4 is a block schematic illustrating aspects of an exemplary antenna probe that can be used in accordance with the plasma impedance tomography method of the present invention.

Thus, as illustrated by the block schematic in FIG. 4, an exemplary RF-IV circuit consists of a pair of transformers to pick off the voltage (RFV) and current (RFI) in the antenna circuit. For any given antenna $401$ in the array, the output of the switch is connected to input $402$, which applies the oscillating current to the plasma. The current (RFI $403$) and voltage (RFV $404$) outputs from each sensor element are connected to a set of multichannel, high-speed digitizers whose input impedances are matched to the characteristic impedance of the transformers used in the RF-IV measurement circuit.

It will be noted, however, that one skilled in the art would understand how to construct other measurements of voltage and current for different ranges of frequency or different types of antenna, and any such suitable methods for measurement of voltage and/or current are within the scope of the present disclosure.

Taking the sensor array shown in FIG. 3B as an example and assuming that a suitable Jacobian matrix S has been obtained, in accordance with the present invention, an image reconstruction of the parameters of a plasma can be obtained as will now be described.

In a first step (1) in a method for obtaining an image reconstruction of plasma parameters in accordance with the present invention, an appropriate pulse shape and center frequency for the signal generator is chosen based on a priori knowledge about the plasma under investigation and the voltage amplitude $V_S$ of the signal is chosen to be small, i.e., $eV_S < kT_e$, where k is the Boltzmann constant and $T_e$ is the electron temperature.

In the next step, step (2), signal generator $303$ is connected to the first antenna $301a$ by means of switch $304$, and using signal generator $303$, an oscillating signal as determined in step (1) is controllably applied to a first of the antennas $301a$, where the parameters of the signal are determined as described in step (1).

In step (3), using the digitizers coupled to that antenna, a time series of values for each of $301a\_V$, $301a\_I$, $301b\_V$, $\ldots$, $301h\_I$ is recorded and data of each of those time series, referred to herein as an "acquisition," is output to remote processor $306$ or to a data storage device for later processing.

Each of steps (2)-(3) is then repeated for each of the antennas $301b$-$301h$ in the array, with the switch controllably applying the signal to each antenna and the time series for each of $301a\_V$, $301a\_I$, $301b\_V$, $\ldots$, $301h\_I$ resulting from the application of the signal to that antenna being output for processing.

In the next step, step (4), using a processor such as remote processor $306$, the fast Fourier transform (FFT) of each of $301a\_V$, $301a\_I$, $301b\_V$, $\ldots$, $301h\_I$ is computed, and in step (5) the self- and the mutual impedances produced by the signal are computed using the appropriate ratios of the FFTs. For example, the mutual impedance $Z_{12}$ between antenna $301a$ and $301b$ can be approximated as $Z_{12} \approx 301a\_V/301b\_I$.

In the next step, a vector m as set forth in Equation (12) is assembled by the processor, and an inversion in accordance with Equation (13) is carried out to determine the vector p, which is then reshaped by the processor into a two-dimensional image for display, where the two-dimensional image illustrates a plasma density, a magnetic field distribution, or both.

Previous impedance probe methods have been operated by sweeping the applied frequency and sequentially measuring the impedance at each frequency. Although using this sequential method would provide the impedance information needed to reconstruct the images of plasma parameters, the time resolution of the measurement would be poor compared to the present invention, and the time needed to make such measurements sequentially would be too long to be feasible, especially in a time-varying plasma. Consequently, instead of using sequentially applied signals, each at a different frequency, in the method of the present invention, a single short bipolar pulse is applied to each antenna as the driver stimulus, where each pulse is a Gaussian monopulse having a shape that is the derivative of a Gaussian:

$$y_{Gmp}(t) = e^{\frac{1}{2}} \omega_c t e^{-\frac{\omega_c^2 t^2}{2}}. \tag{14}$$

This signal has a pulse shape in frequency space, and the center frequency $\omega_c = 2\pi f_c$ can be positioned over the range where we expect to find the resonant frequencies of interest in the plasma. The Gaussian monopulse stimulus injects all the frequencies of interest at once. By digitizing the RFI and RFV signals for each probe simultaneously and Fourier transforming the signals, the mutual impedance spectra for all of the receiving antennas can be determined in one acquisition. In the exemplary system illustrated in FIG. 3B, sixteen acquisitions are required to construct an image of the plasma. Each antenna is sequentially driven, and the voltage for each of the remaining receiving antennas is recorded. In an exemplary case with sixteen antennas, a complete tomographic measurement of the plasma can thus be completed using only sixteen short data acquisitions. By employing the pulsed acquisition method in accordance with the present invention, not only can the measurements be completed in a reasonable amount of time, these measurements can be obtained fast enough to image the temporal evolution of the plasma density and magnetic field.

The limit to the acquisition time for the measurement is set by the frequency resolution that is necessary for the impedance measurement and the number of antennas. In many cases, a reasonable frequency resolution would be about 10% of the expected resonant frequency in the impedance spectrum. An antenna array size on the order of 10 would result in a measurement rate of about 1% of the expected resonant frequency. For example, at a plasma density of $10^8$ cm$^{-3}$ and a plasma frequency of 100 MHz, we could expect a measurement rate of 1 MHz or a time resolution of 1 µs. The damping rate of the stimulus in the plasma also affects the measurement rate, since the plasma response to the previous pulse must be allowed to decay away before starting the next acquisition.

EXAMPLE

In order to demonstrate the PIT technique of the present invention, numerical simulations were conducted to both determine the Jacobian and to simulate measurements of a known density distribution for which a reconstruction will be produced. For these simulations, it was assumed that the plasma was unmagnetized, and eight single dipole antennas were placed in a plane at the edge of a 50-cm diameter plasma in an arrangement similar to that illustrated in FIG. 3B. The dipole axes were aligned with the azimuthal direction. Poisson's equation was solved assuming the charge distribution on the driven antenna was:

$$\rho = \begin{cases} -\dfrac{1}{i\omega L}, & x \geq 0, \\ \dfrac{1}{i\omega L}, & x < 0, \end{cases} \quad (15)$$

which is equivalent to assuming a triangular current density.

To generate the Jacobian, a series of simulations were conducted using a uniform background plasma and a 1-cm diameter perturbation where the plasma frequency was increased by 10%. The location of the perturbation was scanned throughout the space and a numerical simulation was completed at each position, while recording the resulting mutual impedance measured by each antenna.

Figure 5:
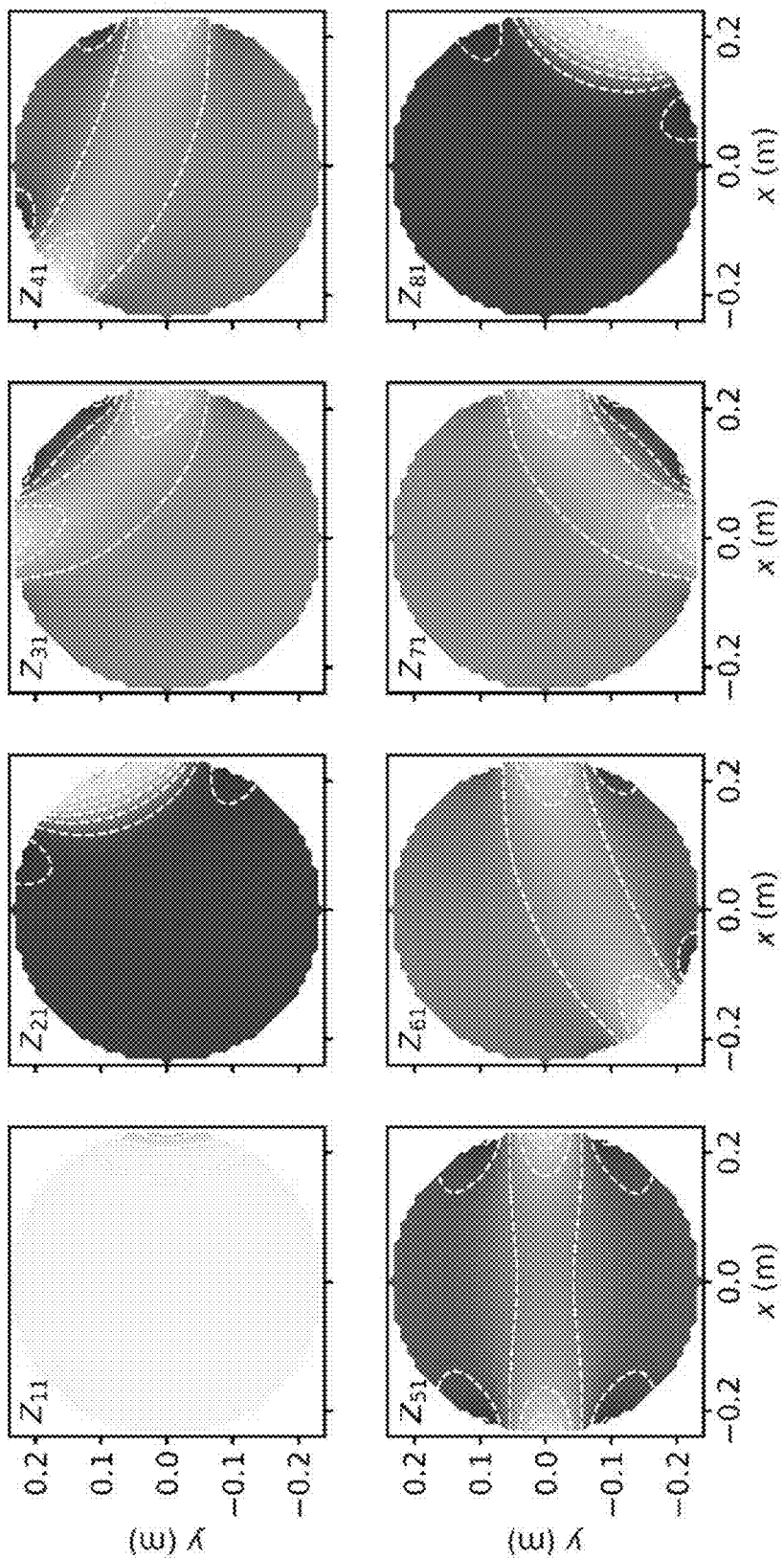
FIG. 5 is a series of maps showing an exemplary measured impedance for a specified probe driver frequency.

FIG. 5 is a series of maps showing the measured imaginary part of the impedance when the first antenna, located on the right-hand-side of circle, is the driven antenna. The first panel is the self-impedance of the first antenna $Z_{11}$, and the second panel shows the mutual impedance where the second antenna is the receiving antenna $Z_{21}$, and so forth. Each pixel has the value of the measured impedance when the perturbation was placed at the location of the pixel. The contour lines provide a visual guide for the spatial area that is interrogated by each measurement. The data for each of the maps shown in FIG. 5 will become a row in the Jacobian matrix after subtracting the background measurement and dividing by the perturbation.

The PIT method in accordance with the present invention uses mutual impedance information for a wide range of frequencies. In order for these measurements to provide more than noise reduction, the paths of the oscillating current throughout the plasma must be different when the driver frequency is changed. The different current paths sample different regions of the plasma providing new spatial information for the tomography reconstruction.

Figure 6:
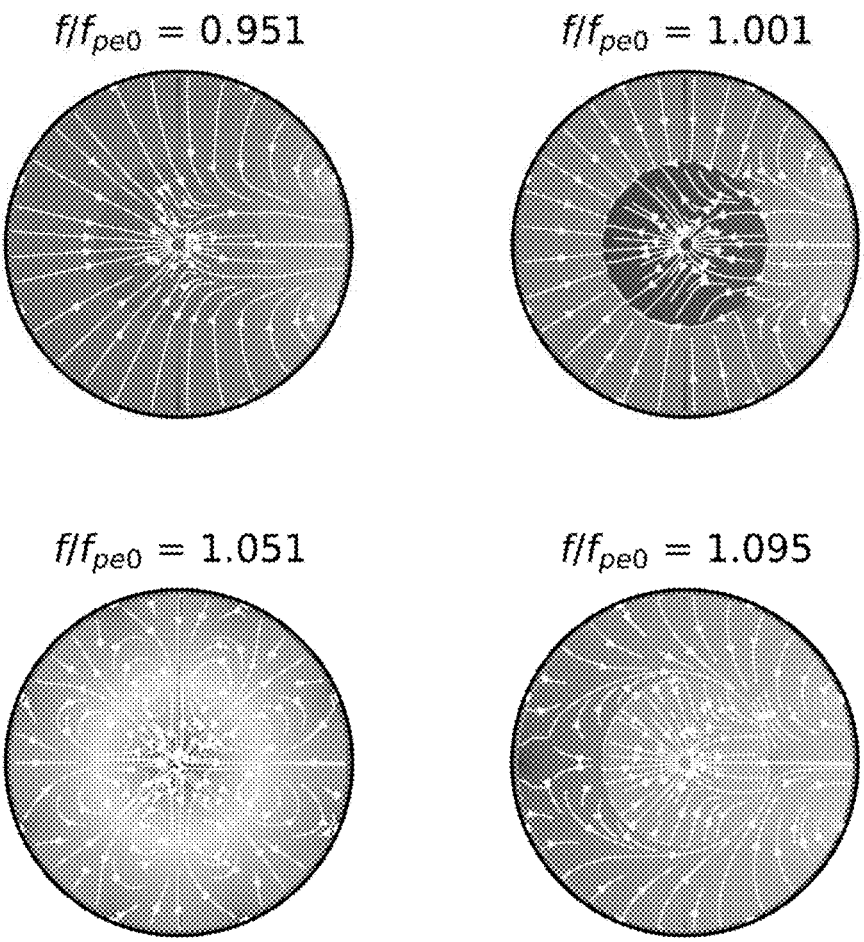
FIG. 6 is a series of maps showing exemplary current paths through a plasma having a specified plasma frequency and probe driver frequency.

FIG. 6 shows the total current in the filled contour plot and the current paths in the streamlines from four numerical simulations each with a different frequency normalized to the background plasma frequency. For these simulations, the central region of the plasma has a 10% higher plasma frequency than the plasma near the edge. As can be seen from the streamlines in FIG. 6, the current paths are radically altered going from just below the background plasma frequency to just below the central plasma frequency.

Numerical simulations were conducted using three different density structures that each had a 10% higher density above the background for a single frequency far below the plasma resonances. The first structure was a 10-cm diameter region centered on the origin, the second was a 10-cm diameter region offset by 10 cm in the x and y directions, and the third adds a second 10-cm diameter region to the second case, this second region being offset from the center by −10 cm in the y direction. These simulations provided the mutual impedance measurements from the same eight antennas used to determine the Jacobian. A measurement vector m was construct as described in Equation (12) and multiplied by the Moore-Penrose pseudoinverse as described in Equation (13).

Figure 7C:
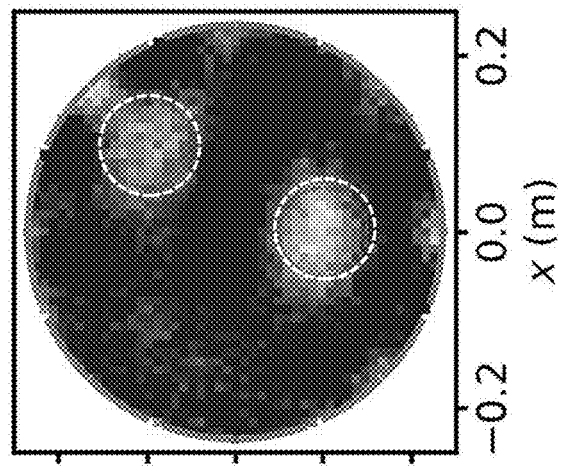
FIGS. 7A-7C are plots showing three exemplary reconstructions of plasma density based on a single probe frequency in accordance with the plasma impedance tomography method of the present invention.
Figure 7B:
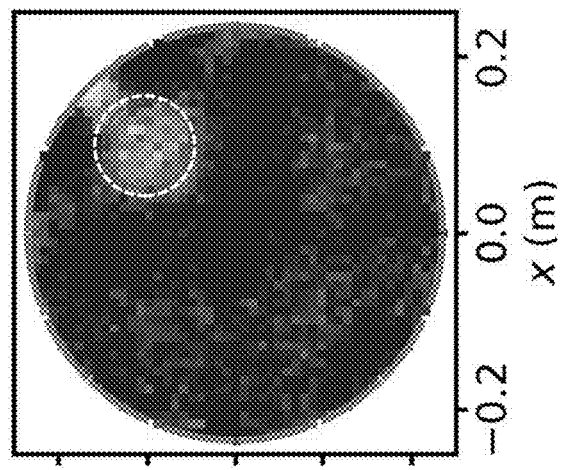
Figure 7A:
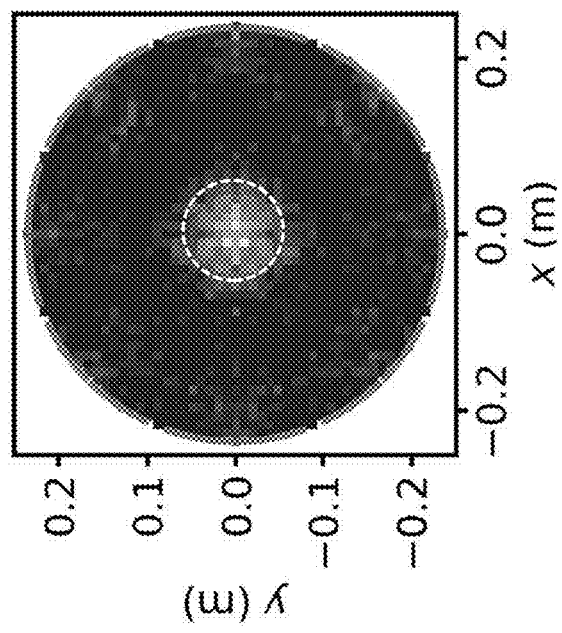

The resulting vector of pixel parameters p was reshaped, and the resulting images are shown in FIGS. 7A-7C. The dashed white circles indicate the size and location of the density structures that were being imaged. The numerical simulations demonstrate that the PIT method is capable of locating density perturbations that are on axis (FIG. 7A), that are offset (FIG. 7B), and differentiating between two density perturbations (FIG. 7C). The simple pseudoinverse reconstruction procedure at a single frequency described above already does a good job of locating the density structures in space and provides the peak density to within approximately 10%. However, the pseudoinverse struggles with very sharp boundaries like the ones chosen here, resulting in structures that are narrower than in reality.

A variety of inversion algorithms exist for tomographic reconstructions of EIT systems, which could be applied to PIT to improve upon the pseudoinverse. A tailored algorithm for PIT, which incorporates the multi-frequency spectra and our knowledge of the plasma dispersion is being developed. As of now, existing inversion and regularization algorithms, which rely on assuming that the system can be linearized and a suitable Jacobian function can be estimated, are being used. The Jacobian can either be determined from numerical simulations as demonstrated here or determined experimentally by physically applying the necessary perturbations. The resulting Jacobian gives the measured response to each applied impulse and serves as a basis for expanding subsequent measurements of an unknown plasma.

Advantages and New Features

The plasma impedance sensor array used in PIT are a non-invasive measurement as they can sit at the edge of the plasma and do not need to be inserted. For applications with insulating boundaries, one could place the impedance probe array outside the vacuum vessel. This method has clear advantages over methods that need to insert a probe into the plasma, which inherently alters the plasma that is being measured. The applied oscillating amplitudes are kept purposefully small (energy in oscillating voltage is smaller than the thermal energy in the electrons) in order to maintain a linear response from the plasma.

The multi-frequency impedance measurements provide a multiplicative factor to the amount of available information for the inversion. This is the equivalent of increasing the number of antennas making measurements at a single frequency. Higher spatial resolution images can be obtained with many fewer antennas by exploiting multi-frequency impedance spectra.

A unique aspect of this measurement method is that it can measure both plasma density and magnetic field. The other diagnostics described in the background section can only measure one or the other. In fact, often knowledge of one is necessary to interpret the results and make a measurement of the other.

Alternatives

In this patent disclosure, dipole antennas were chosen to measure the mutual impedance of the antenna plasma system. However, these measurements could be made using a variety of different antennas. The predicted mutual impedance would be modified by the choice of antenna, but the overall method would be the same. For example, the dominant mutual impedance between two dipoles is capacitive, while it is inductive for loop antennas, however, the plasma dielectric enters into the two mutual impedances in the same way.

There are alternate standard ways of measuring the complex impedance. The method discussed here uses the RF-IV method; however, the network analyzer method that uses reflection coefficients to back out the measured impedance is also a viable measurement technique.

The Gaussian monopulse has useful properties as the driver stimulus for the pulsed impedance measurement. Alternate pulse shapes, such as a square pulse or a raised cosine, could just as well be used in this measurement method. The pulse shape merely determines the frequency distribution that is output.

We chose to focus on a probe array that surrounds the plasma that we are diagnosing, however, the shape of the probe array is not an integral part of the measurement method. The shape should be chosen based on the application. A linear or planar array would be just as effective. In addition, these arrays could be stacked to give three-dimensional images of the plasma.

Plasma Impedance Tomography provides a non-invasive method for making real-time, spatial measurements of plasma density and magnetic field, taking advantage natural resonances in the plasma to provide higher spatial resolution images using fewer antennas.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. An apparatus for imaging a charged particle density and a magnetic field of a plasma, comprising:

a plurality of equally spaced-apart crossed antennas arranged in a predetermined array around a predetermined region of the plasma, each of the antennas forming a pair of antennas 2,1 between itself and another antenna in the array;

an oscillating signal source coupled to each of the antennas in the array, the signal source being configured to controllably apply an oscillating signal to each of the antennas in the array in a predetermined sequence, each of the applied signals producing a self-impedance $Z_{11}$ in the antenna to which the oscillating signal is applied and a mutual impedance $Z_{21}$ between that antenna and each of the other antennas in the array;

means for measuring the induced self-impedance and induced mutual impedance for each of the antennas in the array; and means for measuring an induced oscillating voltage and oscillating current produced from the impedance at each of the antennas in the array;

wherein the values of the self-impedances, the mutual impedances, the oscillating voltage, and the oscillating current provide information regarding a density of charged particles and a distribution of a magnetic field in the plasma.

2. The apparatus according to claim 1, wherein the antennas comprise a plurality of dipole antennas, each dipole antenna having a first arm parallel to a magnetic field of the plasma and a second arm perpendicular to the magnetic field of the plasma.

3. The apparatus according to claim 1, wherein the antennas are arranged in a planar circular array around the region of the plasma.

4. The apparatus according to claim 1, further comprising a processor programmed with appropriate software;

wherein the processor receives data of at least one of the self-impedances, mutual impedances, oscillating voltages, and oscillating currents and transforms the data into a visual image of a density of charged particles and a distribution of a magnetic field in the plasma.

5. A method for measuring a density of charged particles in a plasma comprising:

applying an oscillating signal to each of a plurality of antennas arranged in a predetermined array around a region of the plasma;

wherein the oscillating signal induces a self-impedance $Z_{11}$ within each antenna 1 and a mutual impedance $Z_{21}$ between each pair of antennas 1, 2 in the array; and measuring an oscillating voltage and an oscillating current from each of the impedances $Z_{11}$ and $Z_{21}$;

wherein the oscillating voltages and oscillating currents from all of the impedances $Z_{11}$ and $Z_{21}$ are indicative of the density of charged particles in the plasma.

6. The method according to claim 5, wherein the antennas comprise a plurality of dipole antennas, each dipole antenna having a first arm parallel to a magnetic field of the plasma and a second arm perpendicular to the magnetic field of the plasma.

7. The method according to claim 5, wherein the antennas are arranged in an equally spaced planar circular array around the plasma.

8. A method for measuring a magnetic field in a plasma comprising:

applying an oscillating signal to each of a plurality of antennas arranged in a predetermined array around a region of the plasma;

wherein the oscillating signal induces a self-impedance $Z_{11}$ within each antenna 1 and a mutual impedance $Z_{21}$ between each pair of antennas 1, 2 in the array; and measuring an oscillating voltage and an oscillating current from each of the impedances $Z_{11}$ and $Z_{21}$;

wherein the oscillating voltages and oscillating currents from all of the impedances $Z_{11}$ and $Z_{21}$ are indicative of the magnetic field in the plasma.

9. The method according to claim 8, wherein the antennas comprise a plurality of dipole antennas, each dipole antenna having a first arm parallel to a magnetic field of the plasma and a second arm perpendicular to the magnetic field of the plasma.

10. The method according to claim 8, wherein the antennas are arranged in an equally spaced planar circular array around the plasma.

* * * * *